(12) United States Patent
Homma

(10) Patent No.: US 6,430,090 B1
(45) Date of Patent: Aug. 6, 2002

(54) READ DEVICE AND READ METHOD FOR SEMICONDUCTOR MEMORY

(75) Inventor: Yoshikazu Homma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/746,072

(22) Filed: Dec. 26, 2000

(30) Foreign Application Priority Data

Aug. 18, 2000 (JP) ........................................ 2000-248359

(51) Int. Cl.[7] .............................................. G11C 7/00
(52) U.S. Cl. ............. 365/189.07; 365/210; 365/189.09; 365/189.01; 365/233.5
(58) Field of Search ..................... 365/230.01, 233.5, 365/189.01, 189.07, 189.09, 210, 227

(56) References Cited

U.S. PATENT DOCUMENTS 6,094,394 A * 7/2000 La Rosa ..................... 365/207
6,118,692 A * 9/2000 Banks ................... 365/185.03
6,125,697 A1 * 4/2001 Lu et al. ................. 365/185.03
6,282,145 B1 * 8/2001 Tran et al. ............. 365/230.06

FOREIGN PATENT DOCUMENTS

JP       410092187 A   *   4/1998

* cited by examiner

*Primary Examiner*—Viet Q. Nguyen
(74) *Attorney, Agent, or Firm*—Arent Fox Kintner Plotkin & Kahn, PLLC

(57) ABSTRACT

It is judged whether or not the output voltages of a memory cell and a first reference cell, which is for outputting a voltage at a first reference level to be compared with the output voltage of the memory cell, have reached their respective comparable levels, on the basis of the output voltages of first to third reference cells. After voltage values which can be compared with each other are obtained, the comparison result of the output voltage of the memory cell with the output voltage of the first reference cell is stored in a first latch circuit as the stored data of the memory cell, and the data is output via an output buffer. Thus, even when a reduction of an internal power supply voltage occurs, the data stored in the memory cell can be properly output.

18 Claims, 8 Drawing Sheets

OUTPUT NODE
OF COLUMN DECODER

F I G. 7
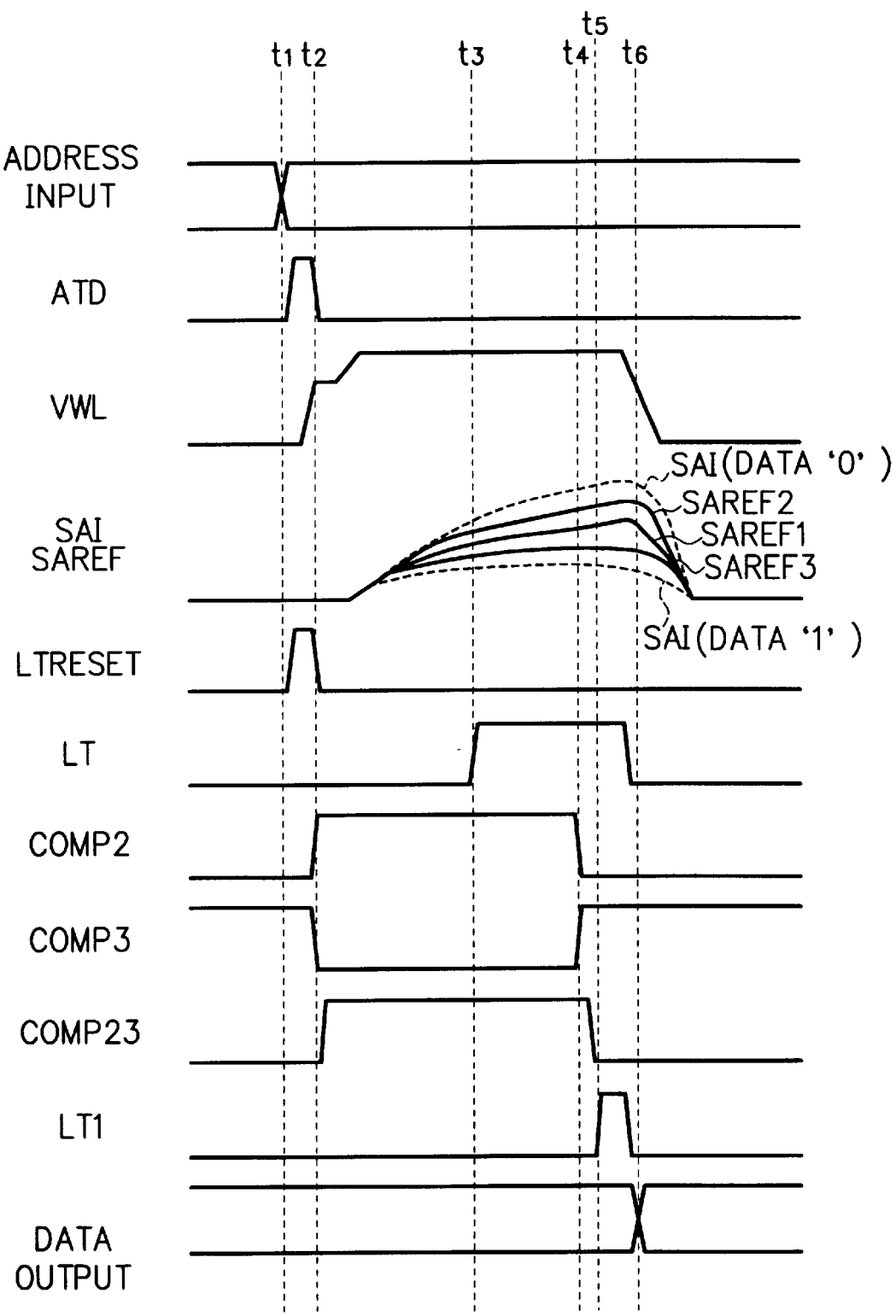

READ DEVICE AND READ METHOD FOR SEMICONDUCTOR MEMORY

BACKGROUND OF THE INVENTION

1. Field of the Invention

The present invention relates to a read device and a read method for a semiconductor memory, particularly to a read device for a semiconductor memory which reads out stored data by boosting an internal power supply voltage.

2. Description of the Related Art

Conventionally, there have been semiconductor memories in which data stored in a memory cell is read out by comparing the output voltage of the memory cell storing the data with the output voltage of a reference cell. Such semiconductor memories include non-volatile semiconductor memories in which data is stored by utilizing the difference in threshold voltage between the memory cell and the reference cell.

For example, in a stacked-gate type non-volatile semiconductor memory such as a flash memory, data is stored in a memory cell by utilizing the phenomenon that the threshold voltage varies in accordance with the number of electrons existing in the floating gate of the transistor making up the memory cell. In case of a memory cell that stores binary data, the threshold voltage of the memory cell is set to fall within one of two threshold voltage ranges.

When reading out data stored in a memory cell as described above, first, the cell current of the memory cell and that of a reference cell, which can be obtained by a read operation, are converted to voltage level signals, respectively. By comparing the voltage level signals with each other, which have been obtained as a result of the conversion, the data stored in the memory cell is read out.

FIG. 1 is a representation for illustrating a relationship among output levels (threshold voltages) of memory cells and those of reference cells in a prior art. FIG. 1 shows the relationship among the output levels (threshold voltages) in the memory cells storing binary data.

In FIG. 1, the threshold voltage ($V_{TH1}$) of a memory cell storing data '1' is set to be lower than the threshold voltage ($V_{THe}$) of an erase verify reference cell which is a first threshold voltage. The threshold voltage ($V_{TH0}$) of a memory cell storing data '0' is set to be higher than the threshold voltage ($V_{THw}$) of a write verify reference cell which is a second threshold voltage.

The first threshold voltage ($V_{THe}$) is set to be lower than the second threshold voltage ($V_{THw}$), and the threshold voltage ($V_{Thr}$) of a read reference cell is set to be between the first threshold voltage ($V_{THe}$) and the second threshold voltage ($V_{THw}$). In other words, the threshold voltages are set to satisfy the relationship of $V_{TH0} > V_{THw} > V_{THr} > V_{THe} > V_{TH1}$.

In recent years, along with the widespread use of portable information devices, a low voltage operation has been required in a non-volatile semiconductor memory. When performing a low voltage operation in a non-volatile semiconductor memory, the voltage of a word line was generally boosted so as to increase the difference between the cell current of a memory cell and that of a reference cell in the read operation, thereby reading out data stored in the memory cell. Moreover, in a non-volatile semiconductor memory, a series of read operations, including the timing to boost the voltage of the word line, etc., were controlled by a timing circuit provided in a non-volatile semiconductor memory in order to reduce the stand-by current.

FIG. 2 is a diagram illustrating an exemplary configuration of a conventional read device for a flash memory using a timing circuit.

In FIG. 2, reference numeral 601 denotes an address buffer. The address buffer 601 converts an externally input address to an internal address to be used in the flash memory and outputs the internal address. Reference numeral 602 denotes an address transition detection circuit. The address transition detection circuit 602 detects a change in the internal address supplied from the address buffer 601.

If a change in the internal address is detected, the address transition detection circuit 602 outputs an address transition signal ATD, and notifies the change in the internal address to a timing circuit 612 and a word line boost circuit 603.

The word line boost circuit 603 generates a voltage VWL for boosting one of word lines WL0, WL1, ..., WLn which is selected by a row decoder 604 on the basis of the address transition signal ATD supplied from the address transition detection circuit 602. The row decoder 604 selects and activates one of the word lines WL0, WL1, ..., WLn of a memory cell array 606 according to the internal address supplied from the address buffer 601.

Reference numeral 605 denotes a column decoder. The column decoder 605 selects and activates one of bit lines BL0, BL1, ..., BLn of the memory cell array 606 according to the internal address supplied from the address buffer 601. Consequently, the desired memory cell in the memory cell array 606 is selected, and the cell current indicating the stored data is supplied to a first cascade type sense circuit 607. The first cascade type sense circuit 607 converts the cell current of the memory cell supplied from the column decoder 605 to a voltage level signal SAI, and outputs the signal to a sense amplifier 608.

Reference numeral 609 denotes a reference word line driver. The reference word line driver 609 activates a word line for reading a reference cell 610, based on which it is determined whether the data stored in the memory cell is '0' or '1'. Consequently, the cell current of the reference cell 610 is supplied to a second cascade type sense circuit 611. In order to read the reference cell 610 under the same conditions as those with the memory cell, a voltage VWL for boosting the voltage of a word line is supplied to the reference word line driver 609 from the word line boost circuit 603. The second cascade type sense circuit 611 converts the cell current of the reference cell supplied from the reference cell 610 to a voltage level signal SAREF, and outputs the signal to the sense amplifier 608.

The sense amplifier 608 compares the voltage value of the signal SAI supplied from the first cascade type sense circuit 607 with that of the signal SAREF supplied from the second cascade type sense circuit 611. In accordance with the comparison result, the sense amplifier 608 determines whether the data stored in the memory cell is '0' or '1'.

More specifically, if the voltage value of the signal SAI supplied from the first cascade type sense circuit 607 is higher than that of the signal SAREF supplied from the second cascade type sense circuit 611 by a predetermined voltage or more, the data stored in the memory cell is determined to be '0'. On the other hand, if the voltage value of the signal SAI supplied from the first cascade type sense circuit 607 is lower than that of the signal SAREF supplied from the second cascade type sense circuit 611 by an a predetermined voltage or more, the data stored in the memory cell is determined to be '1'.

A timing circuit 612 controls respective operation timings of the circuits in the read operation, e.g., the timing at which the voltage of a word line is boosted, the timing at which data is latched, etc., based on the address transition signal ATD supplied from the address transition detection circuit 602.

Reference numeral 613 denotes a latch circuit.

The latch circuit 613 receives the data stored in the memory cell, which has been determined by the sense amplifier 608, in response to a latch signal LT supplied from the timing circuit 612, and temporarily stores the data. The latch circuit 613 supplies the received data to an output buffer 614. The output buffer 614 is a transistor buffer having a high output ability, and outputs the data stored in the memory cell, which has been supplied from the latch circuit 613, to the outside.

FIG. 3 is a diagram illustrating a circuit configuration of the first cascade type sense circuit 607 illustrated in FIG. 2. The first cascade type sense circuit 607 comprises a load 701 such as a resistor, a transistor 702, and an inverter 703. A power supply, the load 701, the transistor 702, the output node of the column decoder 605 are serially 6connected with one another in this order. A signal line of the signal SAI is connected to the intermediate node between the load 701 and the transistor 702. The output of the transistor 702 is fed back to the transistor 702 via the inverter 703.

The first cascade type sense circuit 607 constantly maintains the output voltage of the transistor 702 at a predetermined voltage, thereby converting the supplied cell current to the voltage level signal SAI. For example, assume a case where the threshold voltage of the memory cell storing the data '1' is lower than 4V, and the threshold voltage of the memory cell storing the data '0' is higher than 4V. While maintaining the output voltage of the transistor at 1V, the gate voltage of 4V is supplied to the memory cell, and the data stored in the memory cell is read out.

If the data stored in the memory cell is '1', the supplied gate voltage is higher than the threshold voltage. Thus, a cell current flows through the memory cell, and the voltage value of the signal SAI is thereby reduced. If the data stored in the memory cell is '0', the supplied gate voltage is lower than the threshold voltage. Therefore, no cell current flows through the memory cell, and the voltage value of the signal SAI maintains a high value.

FIG. 4 is a timing chart for illustrating the read operation of the read device for the flash memory illustrated in FIG. 2.

In FIG. 4, an address is supplied from the outside to the address buffer 601 at a time $t_{10}$. The address buffer 601 converts the supplied address to an internal address to be used in the flash memory, and supplies the address to the address transition detection circuit 602. The address transition detection circuit 602 detects a difference of the internal address supplied from the address buffer 601, from the internal address which has been supplied prior to the time $t_{10}$, and activates the address transition signal ATD. By activating the address transition signal ATD, the word line boost circuit 603 starts a boost operation. Thereafter, the voltage VWL continues to be raised. Also, the timing circuit 612 starts an operation timing control for each of the circuits in the read operation.

The internal address converted by the address buffer 601 is supplied to the row decoder 604 and the column decoder 605. According to the supplied internal address, the row decoder 604 and the column decoder 605 select and activate one of the word lines and one of the bit lines in the memory cell array 606, respectively. Consequently, the cell current indicating the data stored in the desired memory cell is supplied to the first cascade type sense circuit 607 from the column decoder 605. The cell current is converted to the voltage level signal SAI at the first cascade type sense circuit 607, and the converted signal is supplied to the sense amplifier 608.

Concurrently, the reference cell 610 is also read. The second cascade type sense circuit 611 converts the cell current to the voltage level signal SAREF, and the converted signal is supplied to the sense amplifier 608.

During this, the voltage VWL is boosted by the word line boost circuit 603, and the voltage values of the signals SAI and SAREF which are supplied to the sense amplifier 608 respectively from the first cascade type sense circuit 607 and the second cascade type sense circuit 611 are gradually increased as illustrated in FIG. 4.

At a time $t_{11}$, after the elapse of a comparison preparation period from the time $t_{10}$, the timing circuit 612 activates the latch signal LT for receiving the data stored in the memory cell, and supplies it to the latch circuit 613. Herein, the comparison preparation period refers to a period which is preset so that a correct read-out result can be obtained. The comparison preparation period is set in consideration of the rising time of a word line, and the period of time necessary for the voltage values of the signals SAI and SAREF to reach voltage values which can be compared with each other by the sense amplifier 608.

The latch circuit 613, which has received the activated latch signal LT, latches the data stored in the memory cell which has be en supplied from the sense amplifier 608. Consequently, at a time $t_{12}$, the data stored in the memory cell corresponding to the externally input address is output from the output buffer 614. A period of time from the time $t_{10}$ to the time $t_{12}$ is referred to as a read operation period.

In the conventional read device as described above, the read operation period (the period of time from the time the to the time $t_{12}$) is a fixed period of time. More specifically, a period of time from the start of the read operation to a point in time when the latch signal LT is activated (the data stored in the memory cell supplied from the sense amplifier 608 is latched in the latch circuit 613) is a certain period of time.

However, when data stored in memory cells is sequentially read out and output, data to be output changes in a short cycle (period of time), for example, in case of the read operation in a page mode or in a burst mode, thereby resulting in a reduction in the internal power supply voltage. Along with the reduction in the internal power supply voltage, a difference between the voltage values of the signals SAI and SAREF is reduced accordingly, and thus, it requires a long time before these voltage values can be compared with each other by the sense amplifier 608. Particularly in a non-volatile semiconductor memory which operates at a low voltage, since the read operation is performed by boosting the internal power supply voltage, it requires a long time before the voltage values can be compared with each other by the sense amplifier 608.

Therefore, when data stored in memory cells is sequentially read out and output, the latch signal LT may be activated before the voltage values can be compared with each other by the sense amplifier 608. In other words, when the sense amplifier 608 is outputting false data, the latch signal LT is activated, thereby outputting the false data to the outside.

SUMMARY OF THE INVENTION

It is an object of the present invention to provide a read device and a read method for a semiconductor memory, wherein data stored in a memory cell can be properly output to the outside even when a reduction of an internal power supply voltage occurs.

The present invention is directed to a read device for a semiconductor memory that comprises a memory cell and a first reference cell for outputting a voltage at a first reference level to be compared with the output voltage of the memory cell. The device reads out the stored data of the memory cell by comparing the output voltage of the memory cell with the output voltage of the first reference cell. The device comprises a judging section for judging as to whether or not the output voltages of the memory cell and the first reference cell have reached their respective comparable levels; and a comparing section for comparing the output voltage of the memory cell with the output voltage of the first reference cell in accordance with the result of judgment by the judging section, and outputting the comparison result as the stored data of the memory cell.

According to another aspect of the present invention, the memory further comprises a second reference cell for outputting a voltage at a second reference level higher than the first reference level; and a third reference cell for outputting a voltage at a third reference level lower than the first reference level, and the judging section compares the output voltage of the first reference cell with the output voltage of the second reference cell and with the output voltage of the third reference cell, for judging, on the basis of the comparison results, as to whether or not the output voltages of the memory cell and the first reference cell have reached their respective comparable levels.

The present invention is also directed to a read method for a semiconductor memory that comprises a memory cell and a first reference cell for outputting a voltage at a first reference level to be compared with the output voltage of the memory cell. The stored data of the memory cell is read out by comparing the output voltage of the memory cell with the output voltage of the first reference cell. The method comprises the steps of judging as to whether or not the output voltages of the memory cell and the first reference cell have reached their respective comparable levels; comparing the output voltage of the memory cell with the output voltage of the first reference cell in accordance with the judgment result; and outputting the comparison result as the stored data of said memory cell.

According to another aspect of the present invention, the memory further comprises a second reference cell for outputting a voltage at a second reference level higher than the first reference level; and a third reference cell for outputting a voltage at a third reference level lower than the first reference level, and the output voltage of the first reference cell is compared with the output voltage of the second reference cell and with the output voltage of the third reference cell, for judging, on the basis of the comparison results, as to whether or not the output voltages of the memory cell and the first reference cell have reached their respective comparable levels.

According to the present invention, it is judged whether or not the output voltage of a memory cell and the output voltage of a first reference cell have reached their respective comparable levels. In accordance with the judgment result, the comparison result between the output voltage of the memory cell and the output voltage of the first reference cell is output as data stored in the memory cell. Accordingly, even when a reduction of the internal power supply voltage occurs, it is possible to output properly the comparison result as the data stored in the memory cell always after the output voltage of the memory cell and the output voltage of the first reference cell have reached their respective comparable levels.

In the case where it is judged whether or not the output voltage of a memory cell and the output voltage of the first reference cell have reached their respective comparable levels, by comparing the output voltage of the first reference cell with the output voltage of the second reference cell, and by comparing the output voltage of the first reference cell with the output voltage of a third reference cell, it is possible to output properly the comparison result as data stored in the memory cell always after the output voltage of the memory cell and the output voltage of the first reference cell have reached their respective comparable levels, for both the voltages higher and lower than the voltage at the first reference level, even when a reduction of the internal power supply voltage occurs.

BRIEF DESCRIPTION OF THE DRAWINGS

FIG. 7 is a timing chart for illustrating a read operation of the read device according to the embodiment.

DETAILED DESCRIPTION OF THE PREFERRED EMBODIMENTS

Hereinafter, an embodiment of the present invention will be described with reference to drawings.

Figure 1:
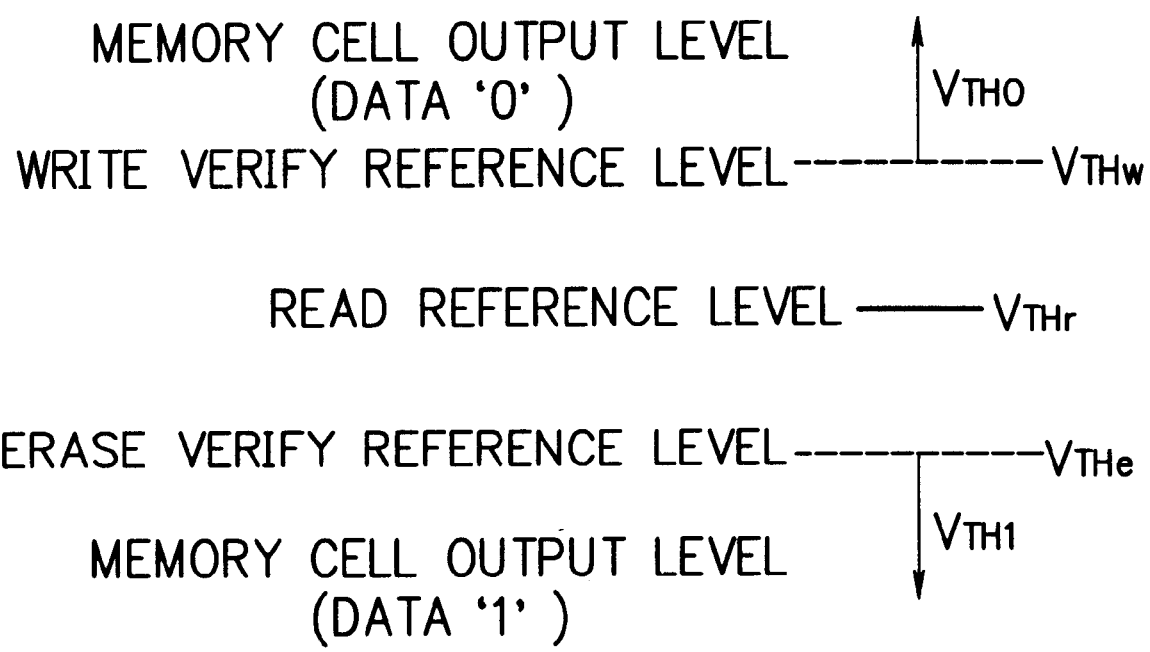
FIG. 1 is a representation showing a relationship among output levels of memory cells storing binary data and those of reference cells according to the prior art.
Figure 2:
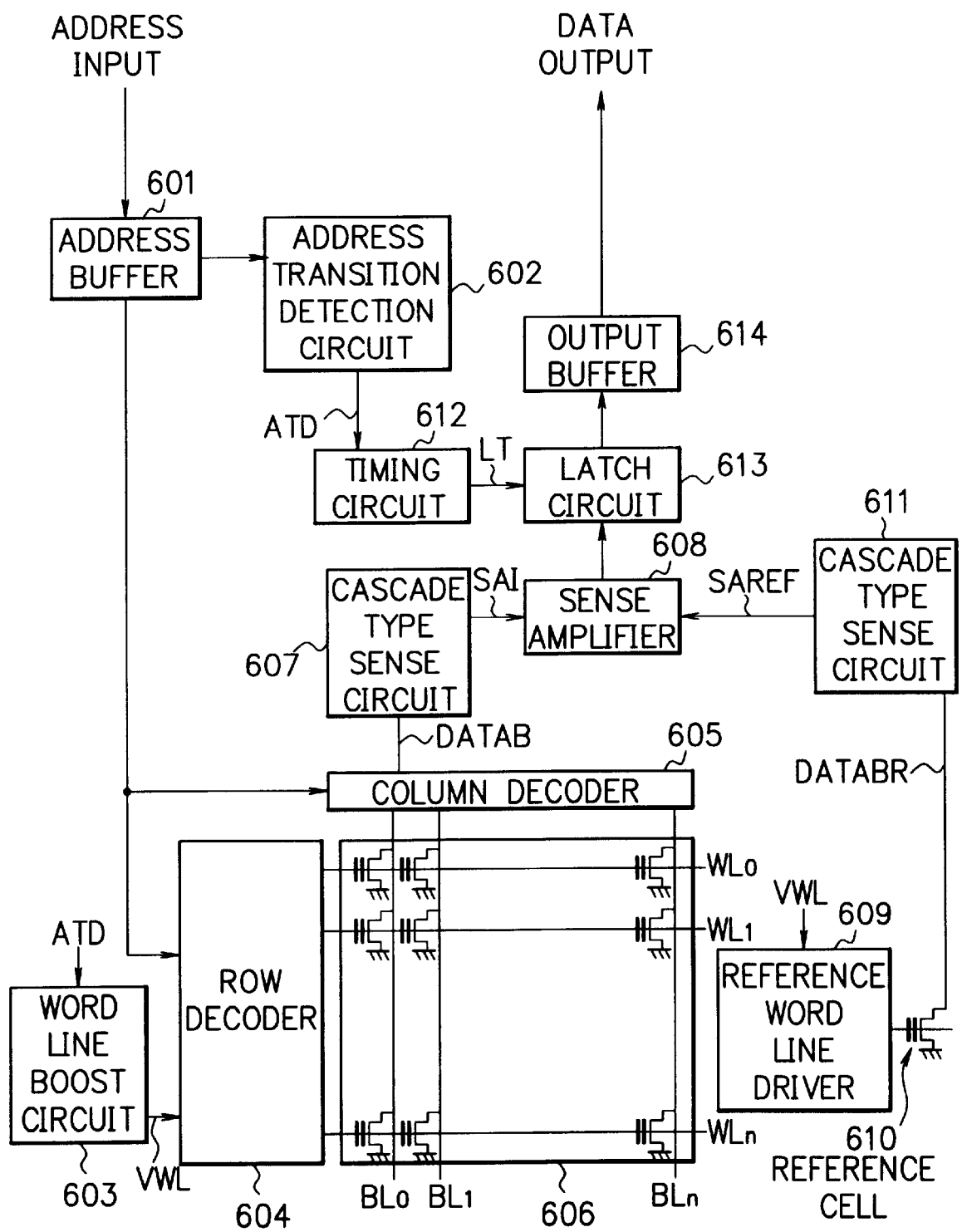
FIG. 2 is a circuit block diagram illustrating an exemplary configuration of a conventional read device
Figure 3:
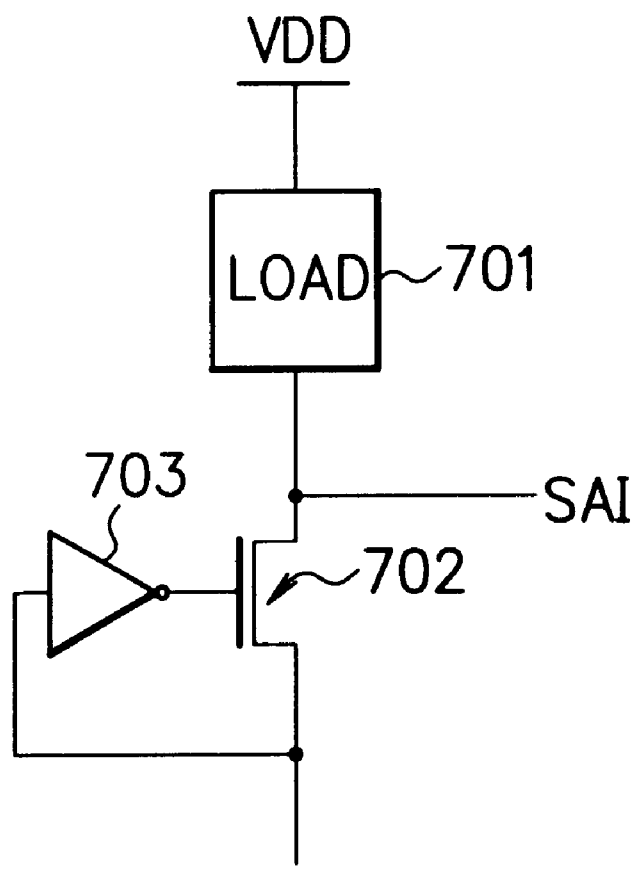
FIG. 3 is a circuit diagram illustrating a configuration of the first cascade type sense circuit illustrated in FIG. 2.
Figure 4:
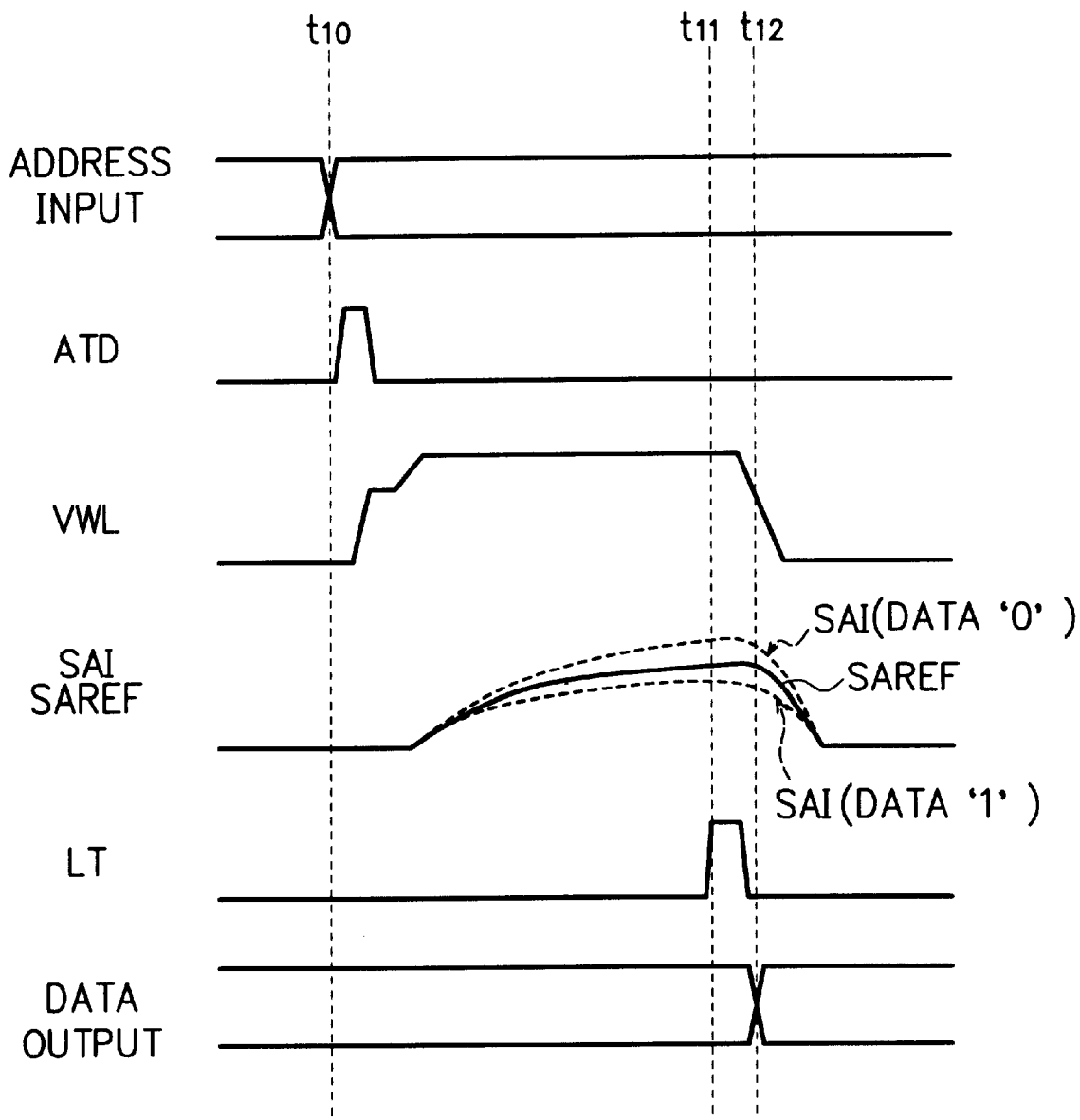
FIG. 4 is a timing chart for illustrating a read operation of the conventional read device.
Figure 5:
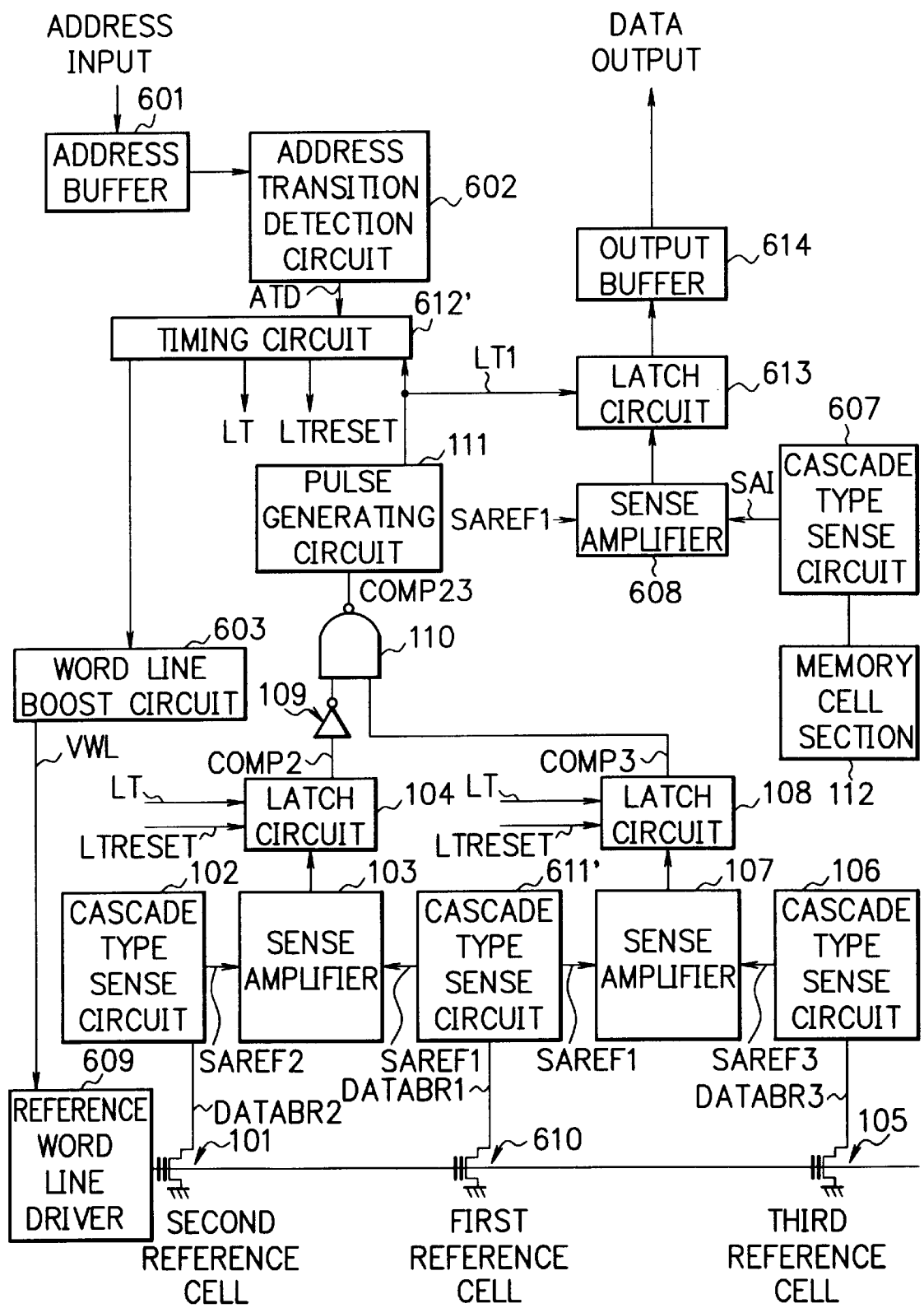
FIG. 5 is a circuit block diagram illustrating an exemplary configuration of a read device for a semiconductor memory according to an embodiment of the present invention.

FIG. 5 is a block diagram illustrating an exemplary configuration of a read device for a semiconductor memory according to an embodiment of the present invention. In FIG. 5, the same blocks as those illustrated in FIG. 2 are denoted by the same reference numerals as those in FIG. 2, and the redundant description thereof will be herein omitted. Also, blocks which are not identical to those illustrated in FIG. 2 but have the same functions as those in FIG. 2 are denoted by reference numerals which are the same as those in FIG. 2 except that each reference numeral is followed by the symbol "'".

The read device for the semiconductor memory illustrated in FIG. 5 reads out data stored in a memory cell which stores binary data.

In FIG. 5, reference numeral 611' denotes a second cascade type sense circuit. The second cascade type sense circuit 611' converts the cell current supplied from the first reference cell 610, which is a read reference cell, to a voltage level signal SAREF1. The second cascade type sense circuit 611' supplies the signal SAREF1, which has been converted to a voltage level signal, to the first sense amplifier 608, a second sense amplifier 103, and a third sense amplifier 107, respectively.

Reference numeral 612' is a timing circuit. The timing circuit 612' controls the respective operation timings of the circuits in the read operation, e.g., the timing to boost the voltage of a word line, based on the address transition signal ATD supplied from the address transition detection circuit 602. For example, the timing circuit 612' outputs a latch reset signal LTRESET for resetting a second latch circuit 104 and a third latch circuit 108. For example, the timing circuit 612' also outputs the latch signal LT for storing the output of the second sense amplifier 103 and that of third sense amplifier 107 which are supplied to the second latch circuit 104 and the third latch circuit 108, respectively.

Figure 6:
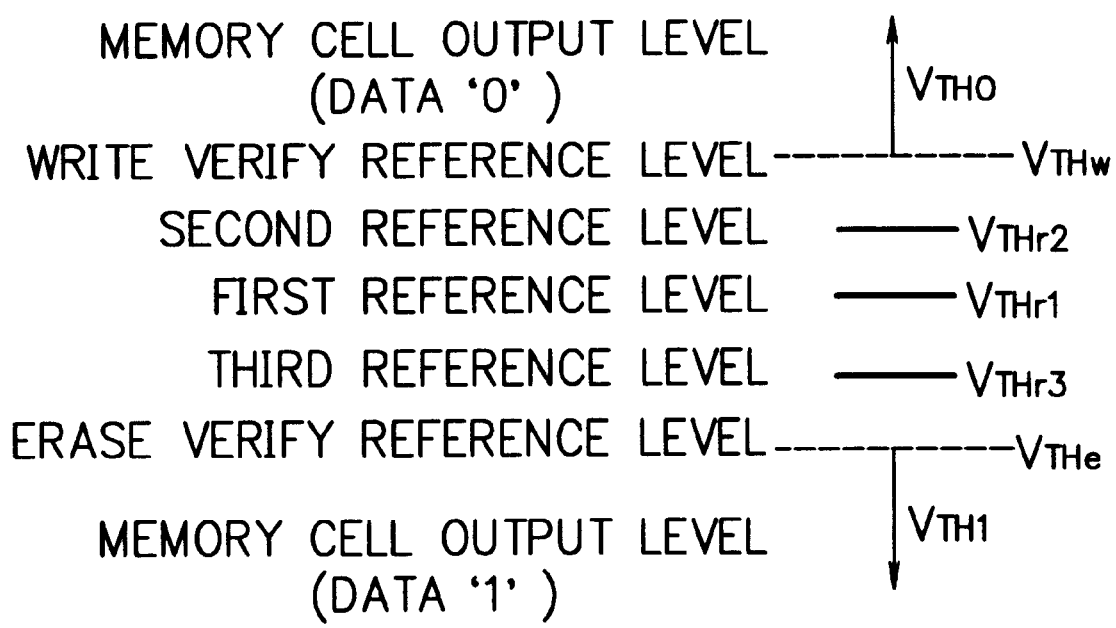
FIG. 6 is a representation showing an exemplary relationship among output levels of memory cells storing binary data and those of reference cells according to the embodiment.

Reference numeral 101 denotes a second reference cell. The second reference cell 101 outputs a second reference level ($V_{THr2}$) which is higher than the output level ($V_{THr1}$) of the first reference cell 610 and lower than the write verify reference level ($V_{THw}$) as shown in FIG. 6. FIG. 6 will be described later in detail. Reference numeral 102 denotes a third cascade type sense circuit. The third cascade type sense circuit 102 converts the cell current supplied from the second reference cell 101 to a voltage level signal SAREF2, and outputs the converted signal to the second sense amplifier 103.

The second sense amplifier 103 compares the voltage of the signal SAREF1 supplied from the second cascade type sense circuit 611' with that of the signal SAREF2 supplied from the third cascade type sense circuit 102. This comparison is performed on two conditions, i.e., (the voltage value of the signal SAREF1)<(the voltage value of the signal SAREF2), and |(the voltage value of the signal SAREF1)− (the voltage value of the signal SAREF2)|$\geq V_u$ ($V_u$ is a predetermined value). As a result of such comparison, if the aforementioned two conditions are simultaneously satisfied, the second sense amplifier 103 outputs data '0' to the second latch circuit 104. In other cases, the second sense amplifier 103 outputs data '1' to the second latch circuit 104.

The second latch circuit 104 stores data output from the second sense amplifier 103 in response to the latch signal LT supplied from the timing circuit 612'. The second latch circuit 104 also forcibly stores the data '1' when the latch reset signal LTRESET supplied from the timing circuit 612' is activated. Thereafter, the second latch circuit 104 outputs the stored data as a signal COMP2. The second latch circuit 104 forms a first latch section of the present invention.

Reference numeral 105 denotes a third reference cell. The third reference cell 105 outputs a third reference level ($V_{THr3}$) which is lower than the output level ($V_{THr1}$) of the first reference cell 610 and higher than the erase verify reference level ($V_{THe}$) as shown in FIG. 6. Reference numeral 106 denotes a fourth cascade type sense circuit. The fourth cascade type sense circuit 106 converts the cell current supplied from the third reference cell 105 to a voltage level signal SAREF3, and outputs the signal to the third sense amplifier 107.

The third sense amplifier 107 compares the voltage of the signal SAREF1 supplied from the second cascade type sense circuit 611' with that of the signal SAREF3 supplied from the fourth cascade type sense circuit 106. This comparison is performed on two conditions, i.e., (the voltage value of the signal SAREF1)>(the voltage value of the signal SAREF3), and |(the voltage value of the signal SAREF1)−(the voltage value of the signal SAREF3)|$\geq V_1$ ($V_1$ is a predetermined value). As a result of such comparison, if the aforementioned two conditions are simultaneously satisfied, the third sense amplifier 107 outputs data '1' to the third latch circuit 108. In other cases, the third sense amplifier 107 outputs data '0' to the third latch circuit 108.

The third latch circuit 108 stores data output from the third sense amplifier 107 in response to the latch signal LT supplied from the timing circuit 612'. The third latch circuit 108 also forcibly stores the data '0' when the latch reset signal LTRESET supplied from the timing circuit 612' is activated. Thereafter, the third latch circuit 108 outputs the stored data as a signal COMP3. The third latch circuit 108 forms a second latch section of the present invention.

Reference numeral 109 denotes an inverter. The inverter 109 inverts the signal COMP2 supplied from the second latch circuit 104, and outputs the inverted signal to a NAND circuit 110. The output of the inverter 109 is supplied to one input of the NAND circuit 110, and the signal COMP3 is supplied to the other input of the NAND circuit 110. The NAND circuit 110 outputs the operation result as a signal COMP23.

For example, if the output of the inverter 109 is '1' (the signal COMP2 is '0') and the signal COMP3 is '1', the NAND circuit 110 makes the signal COMP23 '0'. In other cases, the NAND circuit 110 makes the signal COMP23 '1'. In other words, only when the data '0' is stored in the second latch circuit 104 and the data '1' is stored in the third latch circuit 108, the NAND circuit 110 makes the signal COMP23 '0'. In other cases, the NAND circuit 110 makes the signal COMP23 '1'.

Reference numeral 111 denotes a pulse generating circuit. The pulse generating circuit 111 activates a latch signal LT1 only for a predetermined period of time when the signal COMP23 supplied from the NAND circuit 110 changes from '1' to '0'. The above-described latch signal LT1 is supplied to the first latch circuit 613 and the timing circuit 612'. The first latch circuit 613 stores the output of the first sense amplifier 608 when the latch signal LT1 is activated, and supplies the stored output to the output buffer 614. The timing circuit 612' completes the read operation when the latch signal LT1 is activated.

The above-described first to third reference cells 610, 101, and 105; the above-described second to fourth cascade type sense circuits 611', 102, and 106; the above-described second and third sense amplifiers 103 and 107; the above-described second and third latch circuits 104 and 108; the inverter 109; and the NAND circuit 110 together form a judging section of the present invention.

Reference numeral 112 denotes a memory cell section. The memory cell section 112 is formed by the row decoder 604, the column decoder 605, and the memory cell array 606 illustrated in FIG. 2. The memory cell section 112 selects a desired memory cell in accordance with the internal address supplied from the address buffer 601, and supplies a cell current indicating data stored in the memory cell to the first cascade type sense circuit 607.

FIG. 6 is a representation showing a relationship among output levels (threshold voltages) of memory cells and those of reference cells according to this embodiment. FIG. 6 shows the relationship among the output levels (threshold voltages) in the memory cells storing binary data.

In FIG. 6, the output level (threshold voltage $V_{TH1}$) of a memory cell storing data '1' is set to be lower than the output level (threshold voltage $V_{THe}$) of an erase verify reference cell. The output level (threshold voltage $V_{TH0}$) of a memory cell storing data '0' is set to be higher than the output level (threshold voltage $V_{THw}$) of a write verify reference cell.

The output level (threshold voltage $V_{THr1}$) of the first reference cell 610, which is a read reference cell, is set to be between the output level (threshold voltage $V_{THe}$) of the erase verify reference cell and the output level (threshold voltage $V_{THw}$) of the write verify reference cell. The output level (threshold voltage ($V_{THr2}$) of the second reference cell 101 is set to be between the output level (threshold voltage $V_{THr1}$) of the first reference cell 610 and the output level (threshold voltage $V_{THw}$) of the write verify reference cell.

Similarly, the output level (threshold voltage $V_{THr3}$) of the third reference cell 105 is set to be between the output level (threshold voltage $V_{THr1}$) of the first reference cell 610 and the output level (threshold voltage $V_{THe}$) of the erase verify reference cell.

In other words, the respective output levels of the cells are set so that the threshold voltages satisfy the relationship of $V_{TH0} > V_{THw} > V_{THr2} > V_{THr1} > V_{THr3} > V_{THe} > V_{TH1}$.

By setting the output levels (threshold voltages) as described above, the rising time of the gate of the second reference cell 101 becomes longer than that of the first reference cell 610, and the rising time of the gate of the third reference cell 105 becomes shorter than that of the first reference cell 610.

Next, the read operation of the read device illustrated in FIG. 5 according to this embodiment will be described with reference to FIG. 7.

FIG. 7 is a timing chart for illustrating the read operation of the read device illustrated in FIG. 5.

In FIG. 7, an address is externally supplied to the address buffer 601 at a time $t_1$. The address buffer 601 converts the supplied address to an internal address to be used in a semiconductor memory, and supplies the address to the address transition detection circuit 602. The address transition detection circuit 602 detects that the internal address supplied from the address buffer 601 is different from the internal address which has been supplied prior to the time $t_1$, and activates the address transition signal ATD. By activating the address transition signal ATD, the word line boost circuit 603 starts a boost operation. Thereafter, the voltage VWL continues to be raised.

Also, when the address transition signal ATD is activated, the timing circuit 612' starts an operation timing control for each of the circuits in the read operation, and, at a time $t_2$, activates the latch reset signal LTRESET only for a predetermined period of time. By activating the latch reset signal LTRESET, the data '1' is forcibly stored in the second latch circuit 104, and the stored data '1' is output as the signal COMP2. Also, the data '0' is forcibly stored in the third latch circuit 108, and the stored data '0' is output as the signal COMP3. Therefore, the signal COMP23 which is output from the NAND circuit 110 is '1'.

The internal address converted by the address buffer 601 is supplied to the memory cell section 112, and the cell current indicating data stored in a desired memory cell is supplied to the first cascade type sense circuit 607 from the memory cell section 112. Thereafter, the cell current is converted to the voltage level signal SAI by the first cascade type sense circuit 607, and then supplied to the first sense amplifier 608.

Simultaneously, the first to third reference cells 610, 101, and 105 are also read. The cell current supplied from the first reference cell 610 is converted to the voltage level signal SAREF1 by the second cascade type sense circuit 611', and the signal is supplied to the first to third sense amplifiers 608, 103, and 107.

The cell current supplied from the second reference cell 101 is converted to the voltage level signal SAREF2 by the third cascade type sense circuit 102, and the signal is supplied to the second sense amplifier 103. Similarly, the cell current supplied from the third reference cell 105 is converted to the voltage level signal SAREF3 by the fourth cascade type sense circuit 106, and the signal is supplied to the third sense amplifier 107.

During such an operation, the voltage VWL is boosted by the word line boost circuit 603, and the voltage values of the signals SAI and SAREF1 to SAREF3 are gradually increased as illustrated in FIG. 7.

At a time $t_3$, after elapse of a comparison preparation period from the time $t_1$ at which the read operation is started, the timing circuit 612' activates the latch signal LT. Herein, the comparison preparation period refers to a period which is preset so that data stored in a memory cell can be properly read when the internal power supply voltage is not reduced.

By the activation of the latch signal LT, after the time $t_3$, the second and third latch circuits 104 and 108 start a storing operation for data respectively output from the second and third sense amplifiers 103 and 107. However, if the internal power supply voltage is low at the time $t_3$, the voltage values of the signals SAREF1 to SAREF3 are reduced accordingly. In such a case, the signals COMP2 and COMP3 are not changed as shown in FIG. 7 since the signals SAREF1 to SAREF3 have not yet reached the voltage values satisfying the above-described two conditions at the second and third sense amplifiers 103 and 107.

At a time $t_4$ when the signals SAREF1 to SAREF3 reach the voltage values satisfying the above-described two conditions at the second and third sense amplifiers 103 and 107, the signals COMP2 and COMP3 are changed. Along with the change, the signal COMP23 output from the NAND circuit 110 changes from '1' to '0'

As a result of the change of the signal COMP23 from '1' to '0', the pulse generating circuit 111 activates the latch signal LT1 at a time $t_5$ only for a predetermined period of time.

The latch circuit 613 which has received the activated latch signal LT1 stores data stored in the memory cell, which is the comparison result performed by the first sense amplifier 608 between the signal SAI which is the output of the memory cell and the signal SAREF1 which is the output of the first reference cell. The timing circuit 612' which has received the activated latch signal LT1 deactivates the latch signal LT, and completes the boost operation of the word line boost circuit 603.

At a time $t_6$, the data stored in the memory cell corresponding to the externally input address stored in the first latch circuit 613 is output from the output buffer 614.

As described above in detail, according to this embodiment, it is determined whether or not the output voltage of a memory cell and a reference level voltage output from the first reference cell 610 can be properly compared with each other based on the first to third reference level voltages output from the first to third reference cells 610, 101, and 105. As a result, if it is determined that they can be properly compared with each other, the latch signal LT1 is activated. Consequently, the comparison result between the output voltage of the memory cell and the reference level voltage output from the first reference cell 610 is stored in the first latch circuit 613, and output to the outside via the output buffer 614.

Thus, even if a reduction of the internal power supply voltage occurs, the comparison result will not be output as data stored in the memory cell until the output voltage of the memory cell and the reference level voltage output from the first reference cell 610 reach voltage values which can be compared with each other. The comparison result is output as data stored in the memory cell only after the output voltage of the memory cell and the reference level voltage output from the first reference cell 610 reach the comparable voltage values. Thus, it is possible to properly output data stored in the memory cell.

As long as a reduction of the internal power supply voltage does not occur, data stored in the memory cell can be read out immediately after the passage of the period from the start of the read operation to the comparison preparation period. In other words, as long as a reduction of the internal power supply voltage does not occur, a speed at which the data stored in the memory cell is read out is not slowed.

Also, the output voltage of the first reference cell 610 which outputs the first reference level voltage is compared with the output voltage of the second reference cell 101 which outputs the voltage of the second reference level higher than the first reference level, and the output voltage of the first reference cell is compared with the output voltage of the third reference cell 105 which outputs the voltage of the third reference level lower than the first reference level.

Based on this comparison, it is determined whether or not the output voltage of a memory cell and the first reference level voltage output from the first reference cell 610 can be compared with each other. Therefore, the comparison result is output as data stored in the memory cell only after both of the higher level (voltage) and lower level (voltage) with respect to the first reference level voltage reach the comparable voltage values, thereby making it possible to output the data stored in the memory cell more properly.

In this embodiment, the second reference level is lower than the write verify reference level and higher than the first reference level. However, the second reference level and the write verify reference level may be the same.

Similarly, in this embodiment, the third reference level is higher than the erase verify reference level and lower than the first reference level. However, the third reference level and the erase verify reference level may be the same.

In this embodiment, it is determined whether or not the output voltage of the memory cell and the first reference level voltage can be compared with each other by comparing the first reference level voltage with the second reference level voltage and also by comparing the first reference level voltage with the third reference level voltage. However, it may be determined whether or not the output voltage of the memory cell and the first reference level voltage can be compared with each other by performing only one of the comparison between the first reference level voltage and the second reference level voltage and the comparison between the first reference level voltage and the third reference level voltage. In such a case, the number of circuit components can be reduced.

Alternatively, it may be determined whether or not the output voltage of the memory cell and the first reference level voltage can be compared with each other by comparing the second reference level voltage with the third reference level voltage.

Figure 8:
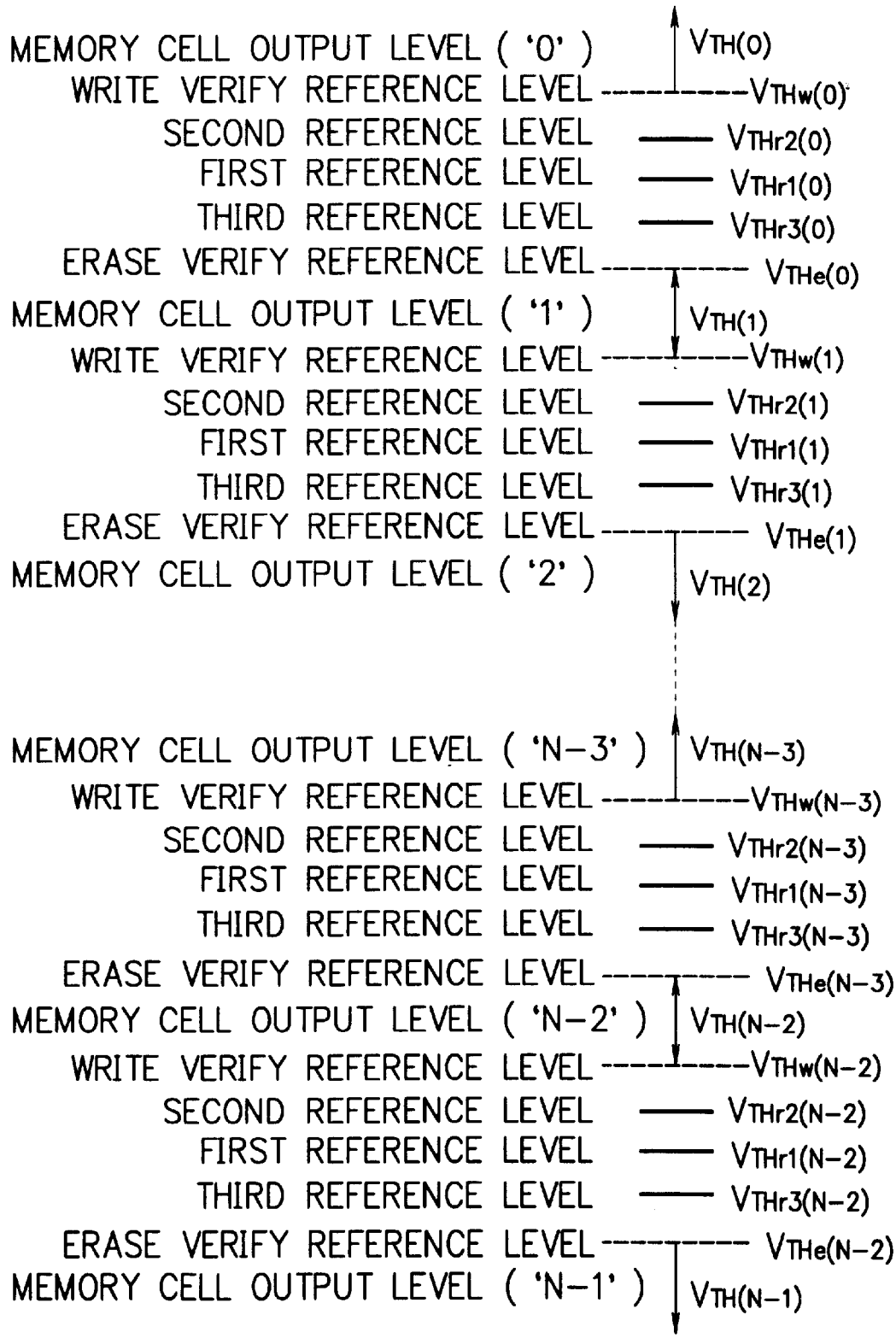
FIG. 8 is a representation showing an exemplary relationship among output levels of memory cells storing multi-value data and those of reference cells according to another embodiment of the present invention.

Although this embodiment concerns the read device for reading out data stored in a memory cell storing binary data, the present invention is not limited to the read device for reading out binary data. The present invention can be also applied to a read device for reading out data stored in a memory cell storing multi-value data. In the case where the present invention is used for reading out multi-value data, first reference levels for reading out the respective data values are set as illustrated in FIG. 8. For each of the first reference levels, a second reference level which is higher than the first reference level and equal to or lower than a write verify reference level for the data value and a third reference level which is lower than the first reference level and equal to or higher than an erase verify reference level for the data value are set.

In such a case, in the same manner as that in the embodiment described above, a circuit for comparing the first reference level voltage with the second reference level voltage, and a circuit for comparing the first reference level voltage with the third reference level voltage are provided for every data value, and data stored in a memory cell may be output by determining whether or not the first reference level voltage and the output voltage of the memory cell can be compared with each other for each of the data values.

What is claimed is:

1. A read device for a semiconductor memory that comprises a memory cell and a first reference cell for outputting a voltage at a first reference level to be compared with the output voltage of said memory cell, said device reading out the stored data of said memory cell by comparing the output voltage of said memory cell with the output voltage of said first reference cell, said device comprising:

at least one additional reference cell, which voltage is at a reference level different from the voltage of said first reference cell;

a judging section for judging as to whether or not the output voltages of said memory cell and said first reference cell have reached their respective comparable levels in accordance with the output voltage of said first reference cell and the output voltage of said at least one additional reference cell; and a comparing section for comparing the output voltage of said memory cell with the output voltage of said first reference cell in accordance with the result of judgment by said judging section, and outputting the comparison result as said stored data of said memory cell.

2. The device according to claim 1, wherein said at least one additional reference cell is a second reference cell for outputting a voltage at a second reference level higher than said first reference level; and said at least one additional reference cell further comprising a third reference cell for outputting a voltage at a third reference level lower than said first reference level, and wherein said judging section compares the output voltage of said first reference cell with the output voltage of said second reference cell and with the output voltage of said third reference cell, for judging, on the basis of the comparison results, as to whether or not the output voltages of said memory cell and said first reference cell have reached their respective comparable levels.

3. The device according to claim 2, wherein said judging section comprises:

a first latch section for storing the comparison result of the output voltage of said first reference cell with the output voltage of said second reference cell; and a second latch section for storing the comparison result of the output voltage of said first reference cell with the output voltage of said third reference cell, and, when reading out the data stored in said memory cell, said first and second latch sections are initialized at the beginning of the reading operation, and, after elapse of a predetermined period of time, when the comparison results stored in said first and second latch sections change from their initialized values, it is judged that the output voltages of said memory cell and said first reference cell have reached their respective comparable levels.

4. The device according to claim 2, wherein the voltage at said second reference level is equal to or lower than a voltage at a reference level for verifying in a data writing operation of said semiconductor memory, and the voltage at said third reference level is equal to or higher than a voltage at a reference level for verifying in a data erasing operation of said semiconductor memory.

5. The device according to claim 2, wherein the threshold voltage of said second reference cell is higher than that of said first reference cell, and the threshold voltage of, said third reference cell is lower than that of said first reference cell.

6. The device according to claim 2, wherein the rising time of the gate voltage of said second reference cell is longer than that of said first reference cell, and the rising time of the gate voltage of said third reference cell is shorter than that of said first reference cell.

7. The device according to claim 1, wherein said at least one additional reference cell is a second reference cell for outputting a voltage at a second reference level different from said first reference level, and wherein said judging section compares the output voltage of said first reference cell with the output voltage of said second reference cell, for judging, on the basis of the comparison result, as to whether or not the output voltages of said memory cell and said first reference cell have reached their respective comparable levels.

8. The device according to claim 1, wherein said at least one additional reference cell is a second reference cell for outputting a voltage at a second reference level different from said first reference level;

said at least one additional reference cell further memory comprising a third reference cell for outputting a voltage of a third reference level different from either of said first and second reference levels, and wherein said judging section compares the output voltage of said second reference cell with the output voltage of said third reference cell, for judging, on the basis of the comparison result, as to whether or not the output voltages of said memory cell and said first reference cell have reached their respective comparable levels.

9. The device according to claim 1, wherein said memory cell stores any of N values (N is a natural number other than one), and said memory comprises:

first reference cells for outputting voltages at (N−1) first reference levels to be compared with the output voltage of said memory cell;

second reference cells for outputting voltages at (N−1) second reference levels each of which is higher than the corresponding one of said (N−1) first reference levels; said at least additional one reference cell being one of said second reference cells; and third reference cells for outputting voltages at (N−1) third reference levels each of which is lower than the corresponding one of said (N−1) first reference levels; and wherein said judging section compares the output voltage of each of said first reference cells with the output voltage of the corresponding one of said second reference cells and with the output voltage of the corresponding one of said third reference cells, for judging, on the basis of the comparison results, as to whether or not the output voltages of said memory cell and said first reference cell have reached their respective comparable levels.

10. The device according to claim 9, wherein the voltage at each of said second reference levels is equal to or lower than a voltage at a reference level for verifying in writing the data value that is to be read out with the corresponding one of said first reference cells, and the voltage at each of said third reference levels is equal to or higher than a voltage at a reference level for verifying in erasing the data value that is to be read out with the corresponding one of said first reference cells.

11. A read method for a semiconductor memory that comprises a memory cell, a first reference cell for outputting a voltage at a first reference level to be compared with the output voltage of said memory cell, the stored data of said memory cell being read out by comparing the output voltage of said memory cell with the output voltage of said first reference cell, and at least one additional reference cell, which voltage is at a reference level different from the voltage of said first reference cell, said method comprising the steps of:

judging as to whether or not the output voltages of said memory cell and said first reference cell have reached their respective comparable levels in accordance with the output voltage of said first reference cell and the output voltage of said at least one additional reference cell;

comparing the output voltage of said memory cell with the output voltage of said first reference cell in accordance with the judgment result; and outputting the comparison result as said stored data of said memory cell.

12. The method according to claim 11, wherein said at least one additional reference cell is a second reference cell for outputting a voltage at a second reference level higher than said first reference level; and said at least one additional reference cell further comprising a third reference cell for outputting a voltage at a third reference level lower than said first reference level, and wherein the output voltage of said first reference cell is compared with the output voltage of said second reference cell and with the output voltage of said third reference cell, for judging, on the basis of the comparison results, as to whether or not the output voltages of said memory cell and said first reference cell have reached their respective comparable levels.

13. The method according to claim 12, wherein a first latch section is provided for storing the comparison result of the output voltage of said first reference cell with the output voltage of said second reference cell, a second latch section is provided for storing the comparison result of the output voltage of said first reference cell with the output voltage of said third reference cell, and, when reading out the data stored in said memory cell, said first and second latch sections are initialized at the beginning of the reading operation, and, after elapse of a predetermined period of time, when the comparison results stored in said first and second latch sections change from their initialized values, it is judged that the output voltages of said memory cell and said first reference cell have reached their respective comparable levels.

14. The method according to claim 12, wherein the voltage at said second reference level is equal to or lower than a voltage at a reference level for verifying in a data writing operation of said semiconductor memory, and the voltage at said third reference level is equal to or higher than a voltage at a reference level for verifying in a data erasing operation of said semiconductor memory.

15. The method according to claim 11, wherein said at least one additional reference cell is a second reference cell for outputting a voltage at a second reference level different from said first reference level, and wherein the output voltage of said first reference cell is compared with the output voltage of said second reference cell, for judging, on the basis of the comparison result, as to whether or not the output voltages of said memory cell and said first reference cell have reached their respective comparable levels.

16. The method according to claim 11, wherein said at least one additional reference is a second reference cell for outputting a voltage at a second reference level different from said first reference level; and said at least one additional reference cell further comprising a third reference cell for outputting a voltage of a third reference level different from either of said first and second reference levels, and wherein the output voltage of said second reference cell is compared with the output voltage of said third reference cell, for judging, on the basis of the comparison result, as to whether or not the output voltages of said memory cell and said first reference cell have reached their respective comparable levels.

17. The method according to claim 11, wherein said memory cell stores any of N values (N is a natural number other than one), and said memory comprises:

first reference cells for outputting voltages at (N−1) first reference levels to be compared with the output voltage of said memory cell;

second reference cells for outputting voltages at (N−1) second reference levels each of which is higher than the corresponding one of said (N−1) first reference levels, said at least one additional reference cell being one of said second reference cells; and third reference cells for outputting voltages at (N−1) third reference levels each of which is lower than the corresponding one of said (N−1) first reference levels; and wherein the output voltage of each of said (N−1) first reference cells is compared with the output voltage of the corresponding one of said second reference cells and with the output voltage of the corresponding one of said third reference cells, for judging, on the basis of the comparison results, as to whether or not the output voltages of said memory cell and said first reference cell have reached their respective comparable levels.

18. The method according to claim 17, wherein the voltage at each of said second reference levels is equal to or lower than a voltage at a reference level for verifying in writing the data value that is to be read out with the corresponding one of said first reference cells, and the voltage at each of said third reference levels is equal to or higher than a voltage at a reference level for verifying in erasing the data value that is to be read out with the corresponding one of said first reference cells.

* * * * *